US008415697B2

(12) United States Patent
Furukawa

(10) Patent No.: US 8,415,697 B2
(45) Date of Patent: Apr. 9, 2013

(54) LIGHT EMITTING ELEMENT, METHOD FOR MANUFACTURING SAME, AND LIGHT EMITTING DEVICE

(75) Inventor: Chisato Furukawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 248 days.

(21) Appl. No.: 12/886,468

(22) Filed: Sep. 20, 2010

(65) Prior Publication Data

US 2011/0198665 A1 Aug. 18, 2011

(30) Foreign Application Priority Data

Feb. 16, 2010 (JP) ................................ 2010-030931

(51) Int. Cl.
*H01L 33/00* (2010.01)
*H01L 21/00* (2006.01)

(52) U.S. Cl.
USPC ........................ 257/98; 257/E33.074; 438/29

(58) Field of Classification Search ........................ None
See application file for complete search history.

(56) References Cited

U.S. PATENT DOCUMENTS 5,498,568 A * 3/1996 Hosoba et al. .................. 117/89
6,531,405 B1 * 3/2003 Wegleiter et al. ............. 438/745
2004/0079937 A1 * 4/2004 Miyazawa ...................... 257/10
2009/0134412 A1 * 5/2009 Shylo et al. ..................... 257/98

FOREIGN PATENT DOCUMENTS

JP 2001-274458 10/2001
JP 2007-258672 10/2007

* cited by examiner

*Primary Examiner* — Ha Tran T Nguyen
*Assistant Examiner* — Kevin Quinto
(74) *Attorney, Agent, or Firm* — Patterson & Sheridan, LLP

(57) ABSTRACT

According to one embodiment, a light emitting element includes a semiconductor stacked body and a translucent substrate. The semiconductor stacked body includes a light emitting layer. The translucent substrate has one surface and a side surface. The semiconductor stacked body is provided on the upper surface. An unevenness uniformly distributing with average height and average pitch is provided on the side surface.

11 Claims, 7 Drawing Sheets

84b 92 84a 5 90 84 TC1 TP1 80 86 84 82

LIGHT EMITTING ELEMENT, METHOD FOR MANUFACTURING SAME, AND LIGHT EMITTING DEVICE

CROSS-REFERENCE TO RELATED APPLICATIONS

This application is based upon and claims the benefit of priority from the prior Japanese Patent Application No. 2010-030931, filed on Feb. 16, 2010; the entire contents of which are incorporated herein by reference.

FIELD

Embodiments described herein relate generally to a light emitting element, a method for manufacturing the same, and a light emitting device.

BACKGROUND

A light emitting element including a light emitting layer capable of emitting visible light provided on a translucent substrate can reduce total reflection at a side surface of the translucent substrate in the case where a fine unevenness is formed on the side surface. Thus, light extraction efficiency can be increased.

On the other hand, it is required to reduce a profile of the light emitting device when it becomes necessary to reduce a profile of an electronic device including a light emitting device of e.g. SMD (Surface Mounted Device) type mounted on a circuit board. For instance, a thickness of the light emitting element chip is desirably reduced to 150 μm or less in view of the thickness of the mounting member and the height of the bonding wire when it is required to reduce a thickness of the light emitting device to 0.55 mm or less.

If a fine unevenness is formed on the side surface of such a thin chip by e.g. frost treatment, chip yield and also workability would decrease.

DETAILED DESCRIPTION

According to one embodiment, a light emitting element includes a semiconductor stacked body and a translucent substrate. The semiconductor stacked body includes a light emitting layer. The translucent substrate has one surface and a side surface. The semiconductor stacked body is provided on the one surface. An unevenness uniformly distributing with average height and average pitch is provided on the side surface.

According to one embodiment, a light emitting device includes a light emitting element, a first electrode, a second electrode, an insulating member and a sealing resin layer provided in the recess. The light emitting element includes a semiconductor stacked body including a light emitting layer; and a translucent substrate having one surface and a side surface, the semiconductor stacked body being provided on the one surface, an unevenness uniformly distributing with average height and average pitch being provided on the side surface. The first electrode is connected to a lower electrode of the light emitting element. The second electrode is connected to an upper electrode of the light emitting element. The insulating member includes a recess, and each of part of the first electrode and part of the second electrode are exposed at a bottom surface of the recess, and the light emitting element is provided inside the recess.

According to one embodiment, a method for manufacturing a light emitting element is disclosed. The method can include forming a semiconductor stacked body on one surface of a translucent substrate. The method can include forming a trench not reaching another surface of the translucent substrate from a side of the semiconductor stacked body. The method can include forming an unevenness on an inner side surface of the trench. In addition, the method can include grinding the translucent substrate up to the trench from the another surface.

Embodiments of the invention will now be described with reference to the drawings.

Figure 1:
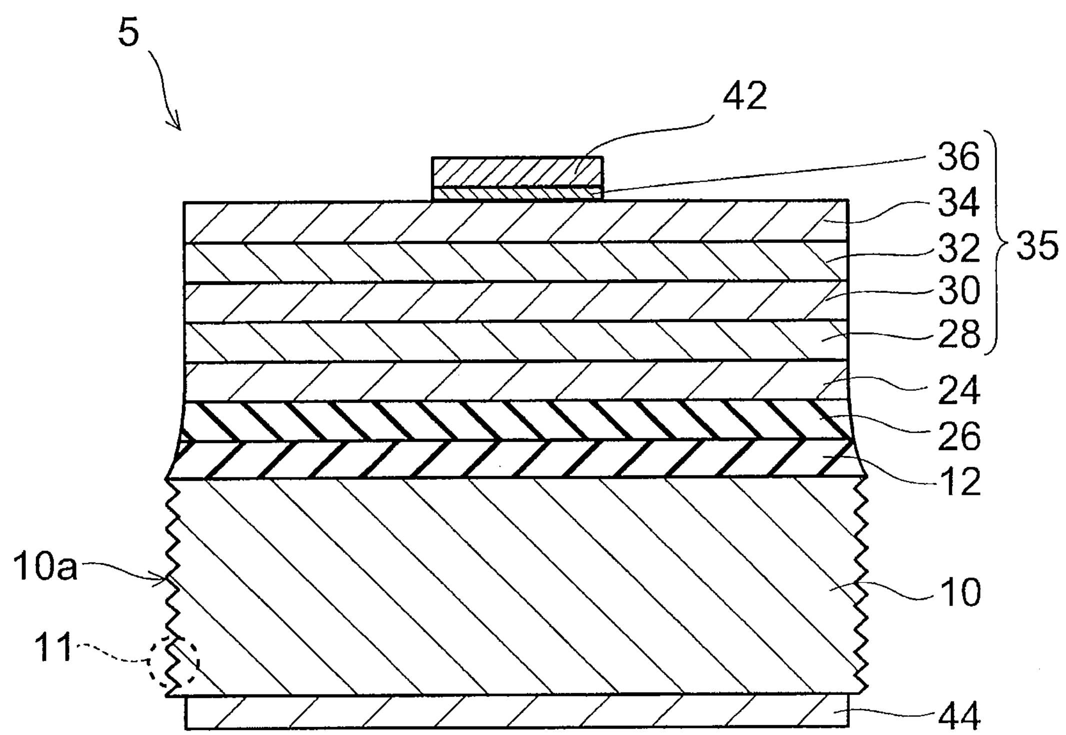
FIG. 1 is a schematic cross-sectional view of a light emitting element according to an embodiment of the invention.

FIG. 1 is a schematic cross-sectional view of a light emitting element according to an embodiment of the invention.

The light emitting element 5 includes a translucent substrate 10. A bonding layer 12, a bonding layer 26, a regrowth foundation layer 24, and an upper growth layer 35 are stacked in this order above the translucent substrate 10. An upper electrode 42 is provided on the upper surface of the upper growth layer 35. A lower electrode 44 is provided on the lower surface of the translucent substrate 10.

The upper growth layer 35 includes, from the translucent substrate 10 side, a first cladding layer 28, a light emitting layer 30, a second cladding layer 32, a current diffusion layer 34, and a contact layer 36 in this order. A fine unevenness 11 is provided entirely and uniformly on the side surface 10_a_ of the translucent substrate 10. In this case, in the cross section of the fine unevenness 11, light flux is emitted with a wider range of angle. Hence, the region of total reflection is narrowed, and the light extraction efficiency is improved.

On the other hand, if the light emitting element 5 is covered with a sealing resin having a refractive index of 1.5, and the translucent substrate 10 made of GaP having a refractive index of 3.45 has a planar side surface, then the critical angle is generally 26 degrees. If emission light from the light emitting layer 30, reflected light from the upper electrode 42 and the lower electrode 44, and reflected light from the interface between a chip and its outside are incident on the side surface 10_a_ at an incident angle equal to or larger than the critical angle, then the light is not emitted to the outside of the light emitting element 5.

Here, the second cladding layer 32, the current diffusion layer 34, and the contact layer 36 are of the same conductivity type, which is one of p-type and n-type. The first cladding layer 28 and the translucent substrate 10 are the other of p-type and n-type.

The upper growth layer 35 including the light emitting layer 30 can be made of $In_y(Al_xGa_{1-x})_{1-y}P$ ($0 \leqq x \leqq 1$, $0 \leqq y \leqq 1$), $Al_zGa_{1-z}As$ ($0 \leqq z \leqq 1$), or $Ga_sIn_{1-s}N_tAs_{1-t}$ ($0 \leqq s \leqq 1$, $0 \leqq t \leqq 1$). Then, the emission light can be in the wavelength range of 530-900 nm. If the bandgap wavelength of the light emitting layer 30 is made longer than the bandgap wavelength of the translucent substrate 10, absorption of the emission light in the translucent substrate 10 can be reduced. Such a translucent substrate 10 can be made of e.g. GaP having a bandgap wavelength of 550 nm, or AlAs having a bandgap wavelength of 570 nm.

The light emitting layer 30 may have a multiple quantum well structure composed of well layers and barrier layers. The light emitting element including a quantum well structure can efficiently confine carriers in the well layer to increase the light emission efficiency, reduce the operating current, and accurately control the emission wavelength.

Figure 2A:
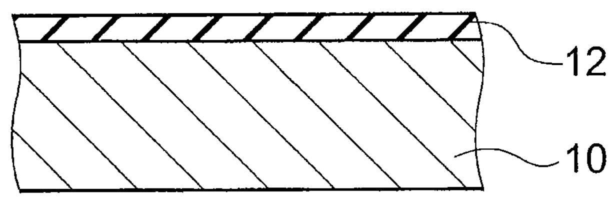
FIGS. 2A to 2D show process sectional views of a method for manufacturing a light emitting element.
Figure 2B:
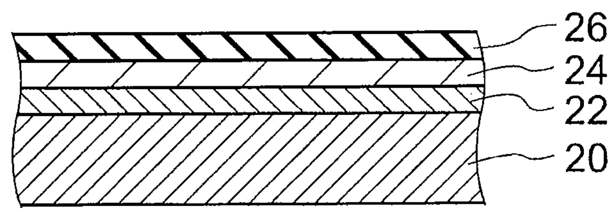
Figure 2C:
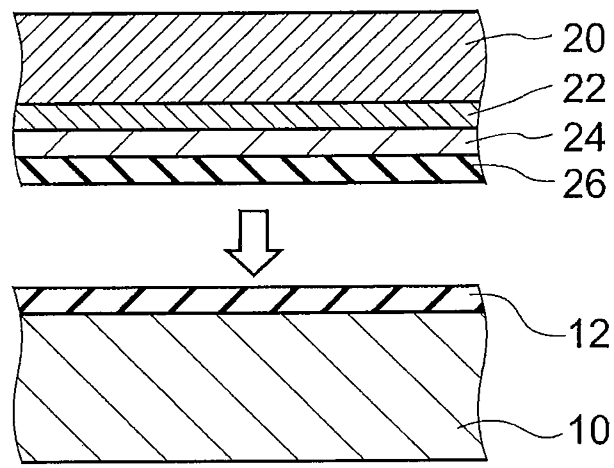
Figure 2D:
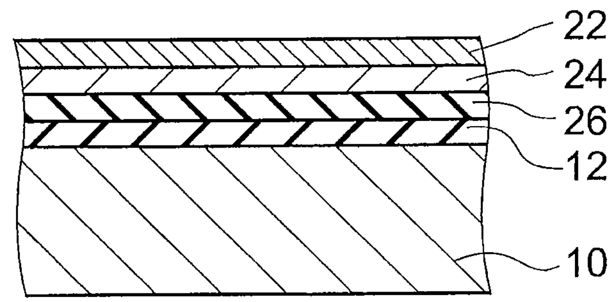

FIGS. 2A to 2D show process sectional views of a method for manufacturing a light emitting element. More specifically, FIG. 2A is a schematic cross-sectional view in which a bonding layer is formed on a translucent substrate. FIG. 2B is a schematic cross-sectional view in which layers up to a bonding layer are formed on a first substrate. FIG. 2C is a schematic cross-sectional view of wafer bonding. FIG. 2D is a schematic cross-sectional view in which the first substrate is removed.

In FIG. 2A, the translucent substrate 10 is made of n-type GaP. A bonding layer 12 of n-type conductivity is formed on the surface of the translucent substrate 10. On the other hand, as shown in FIG. 2B, on the surface of a first substrate 20 made of e.g. n-type GaAs, a buffer layer 22, a regrowth foundation layer 24, and a bonding layer 26 are formed in this order (FIG. 2B).

Subsequently, as shown in FIG. 2C, the bonding layer 12 and the bonding layer 26 are oppositely brought into contact, and wafers are bonded by thermocompression. Furthermore, as shown in FIG. 2D, the first substrate 20 is removed. Preferably, the buffer layer 22 is removed immediately before the next crystal growth.

Figure 3A:
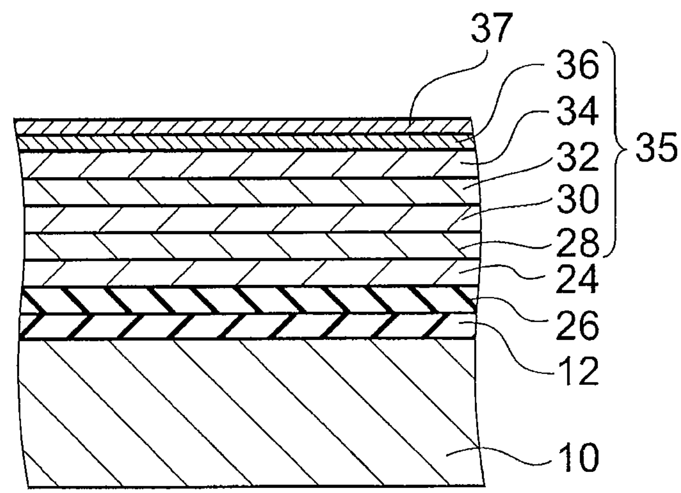
FIGS. 3A to 3C show process sectional views of the method for manufacturing the light emitting element.
Figure 3B:
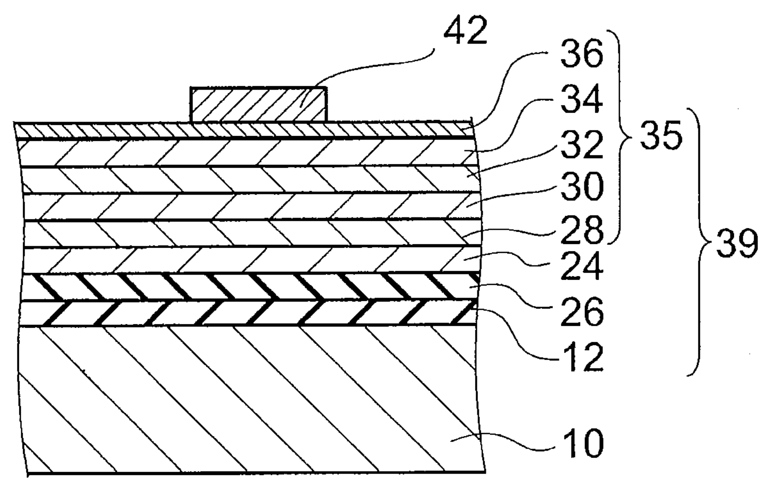
Figure 3C:
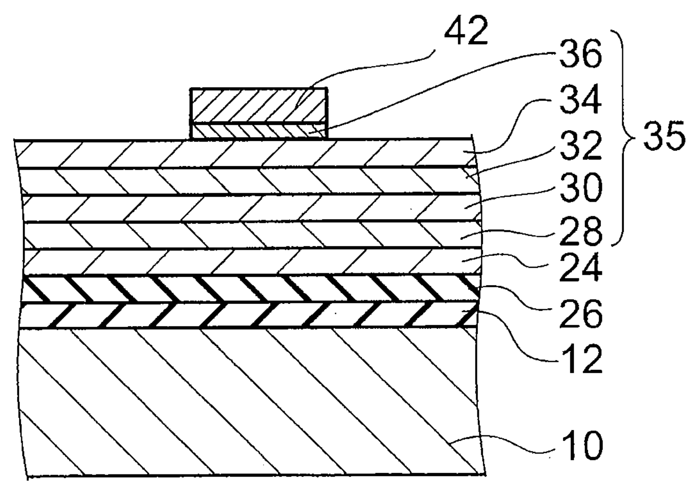

FIGS. 3A to 3C show process sectional views of the method for manufacturing the light emitting element. More specifically, FIG. 3A is a schematic cross-sectional view in which an upper growth layer is formed. FIG. 3B is a schematic cross-sectional view in which an upper electrode is formed. FIG. 3C is a schematic cross-sectional view in which the contact layer is etched. Here, the bonding layer 12, the bonding layer 26, and the regrowth foundation layer 24 on the translucent substrate 10 side, and the upper growth layer 35 grown thereon are referred to as semiconductor stacked body 39.

As shown in FIG. 3A, a first cladding layer (0.6 μm thick) 28 made of n-type $In_{0.5}Al_{0.5}P$, a light emitting layer 30, a second cladding layer (0.6 μm thick) 32 made of p-type $In_{0.5}Al_{0.5}P$, a current diffusion layer (2 μm thick) 34 made of $In_{0.5}(Al_{0.7}Ga_{0.3})_{0.5}P$, a contact layer 36 made of p-type $Ga_{0.5}Al_{0.5}As$, and a dummy layer 37 are grown in this order above the regrowth foundation layer 24 stacked above the translucent substrate 10. Here, the thickness and composition of each layer are not limited thereto. Furthermore, the conductivity type of the translucent substrate 10 and the semiconductor stacked body 39 may be respectively the opposite conductivity type.

The regrowth foundation layer 24 is lattice-matched with GaAs. Hence, even if the regrowth foundation layer 24 is bonded to the translucent substrate 10 having a different lattice constant, a semiconductor layer lattice-matched with GaAs or $In_y(Al_xGa_{1-x})_{1-y}P$ ($0 \leqq x \leqq 1$, $0 \leqq y \leqq 1$) can be crystal-grown above the regrowth foundation layer 24 on the opposite side of the bonding side. Here, wafer bonding may be performed after crystal growth of the stacked body including the light emitting layer. However, the manufacturing method described with reference to FIGS. 2A to 3C is more effective in readily enhancing the crystal quality of the semiconductor stacked body 39.

Such crystal growth may be based on e.g. MOCVD (metal organic chemical vapor deposition) and MBE (molecular beam epitaxy).

Subsequently, as shown in FIG. 3B, the dummy layer 37 is removed and the contact layer 36 on the upper surface of the upper growth layer 35 is exposed. An upper electrode 42 is patterned on the contact layer 36. In the case where the contact layer 36 is made of p-type $Ga_{0.5}Al_{0.5}As$, composition of the upper electrode 42 may be e.g. Au (0.05 μm thick)/AuZn (containing 0.3 wt % Zn, 0.2 μm thick)/Au (0.5 μm thick). Alternatively, the composition may be a non-alloy composition such as Ti/Pt/Au, or may be based on a transparent conductive film such as ITO (indium tin oxide).

In the case where the contact layer 36 is made of GaAs, visible light is absorbed, and light output decreases. In this case, the upper electrode 42 may be used as a mask to remove the contact layer 36 by e.g. wet etching to increase the light output.

Figure 4A:
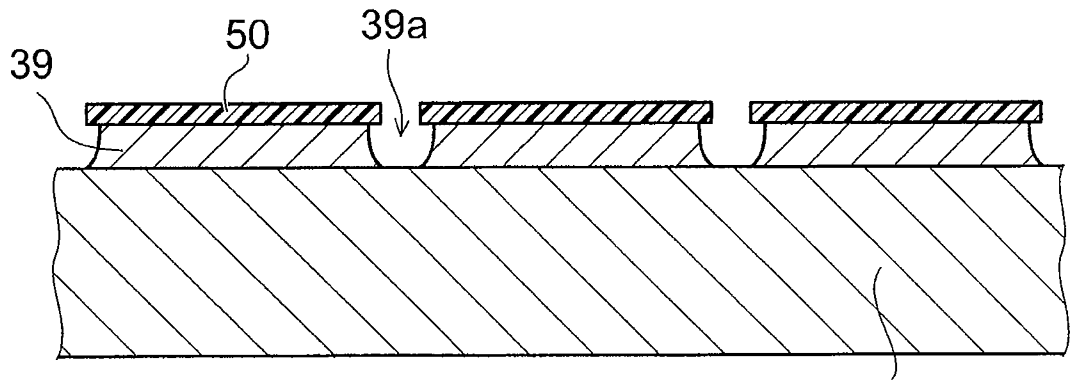
FIGS. 4A to 4C show process sectional views of the method for manufacturing the light emitting element.
Figure 4B:
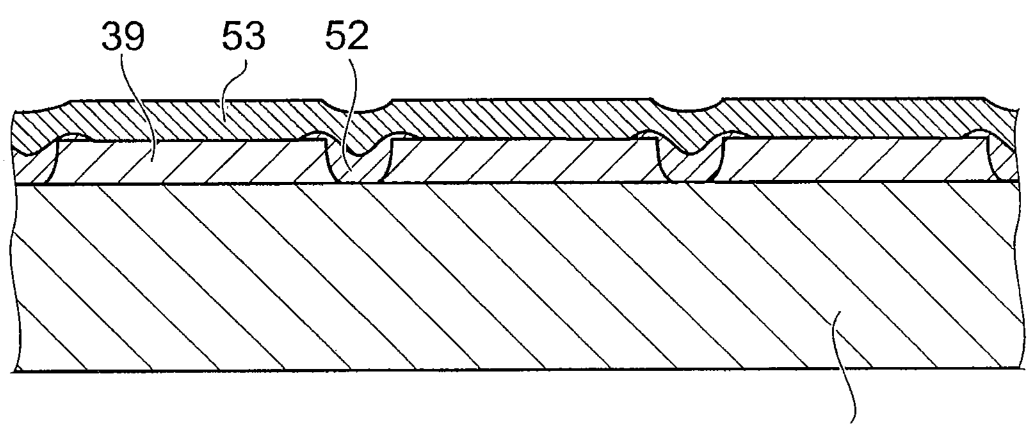
Figure 4C:
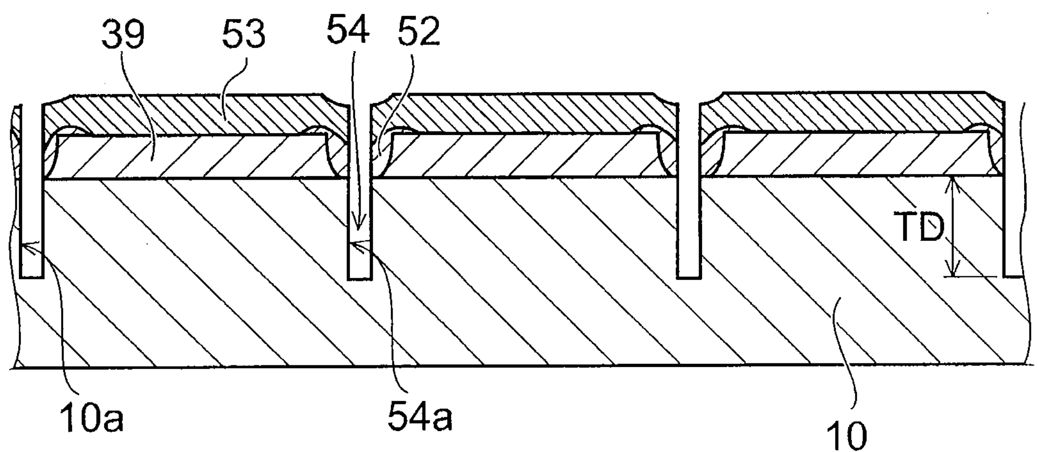

FIGS. 4A to 4C show process sectional views of the method for manufacturing the light emitting element according to this embodiment. More specifically, FIG. 4A is a schematic cross-sectional view in which the semiconductor stacked body is divided. FIG. 4B is a schematic cross-sectional view in which a protective layer is applied. FIG. 4C is a schematic cross-sectional view in which half dicing is performed.

As shown in FIG. 4A, a photoresist film 50 is patterned. A region 39*a* for a dicing street of the semiconductor stacked body 39 is removed by e.g. the wet etching. Furthermore, the photoresist film 50 is stripped. Here, the upper electrode 42, which is provided on the upper surface of the semiconductor stacked body 39, is not shown.

Subsequently, as shown in FIG. 4B, the mesa surface of the semiconductor stacked body 39 exposed by etching is covered with a first protective layer 52. The material of the first protective layer 52 may be a dielectric such as acid-resistant resin, SiN, and $SiO_2$. Furthermore, a second protective layer 53 of photoresist film is formed on the upper surface of the first protective layer 52 and the upper surface of the semiconductor stacked body 39.

Furthermore, as shown in FIG. 4C, half-cut dicing is performed from the second protective layer 53 side using e.g. a blade dicer to form a trench 54 in the translucent substrate 10. A depth TD from the surface of the translucent substrate 10 is e.g. 70-170 μm. Thus, the trench 54 can be formed like a lattice in the translucent substrate 10 as viewed from above.

Figure 5A:
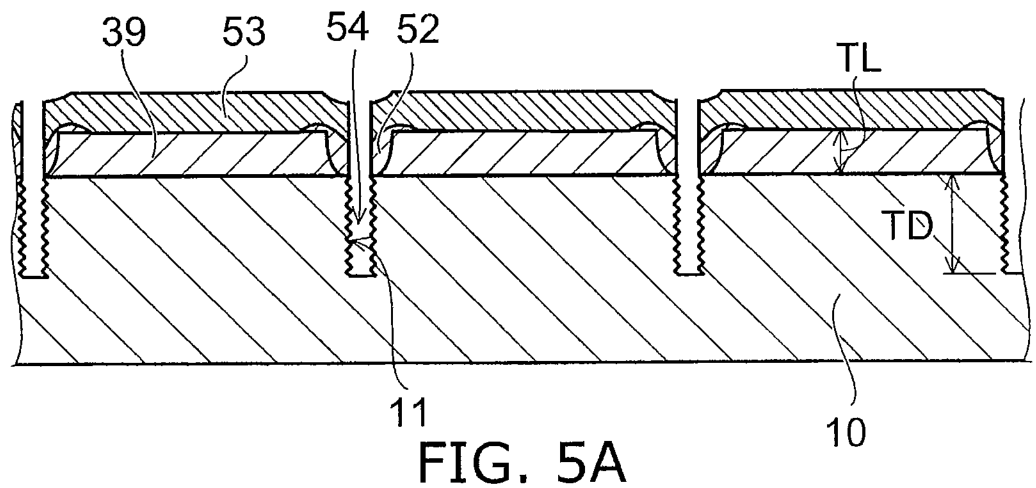
FIGS. 5A to 5C show process sectional views of the method for manufacturing the light emitting element.
Figure 5B:
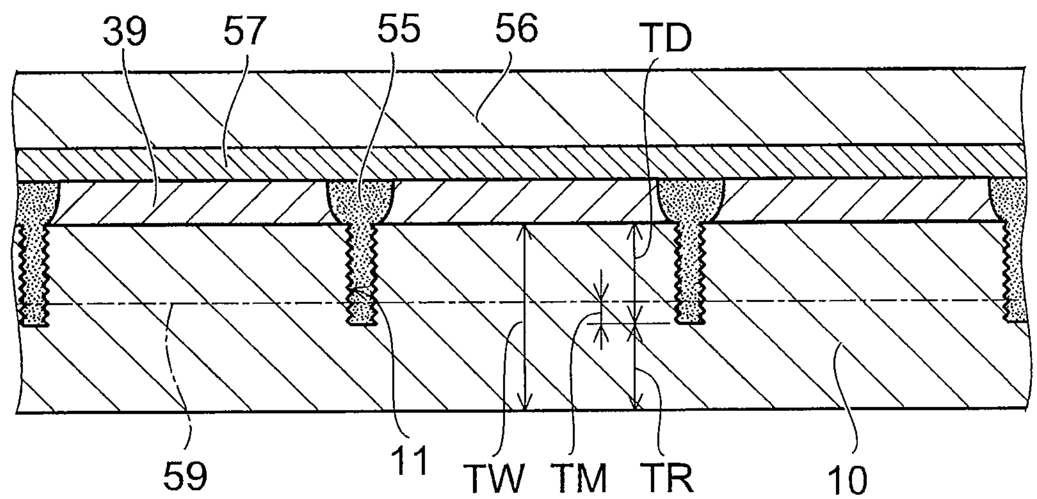
Figure 5C:
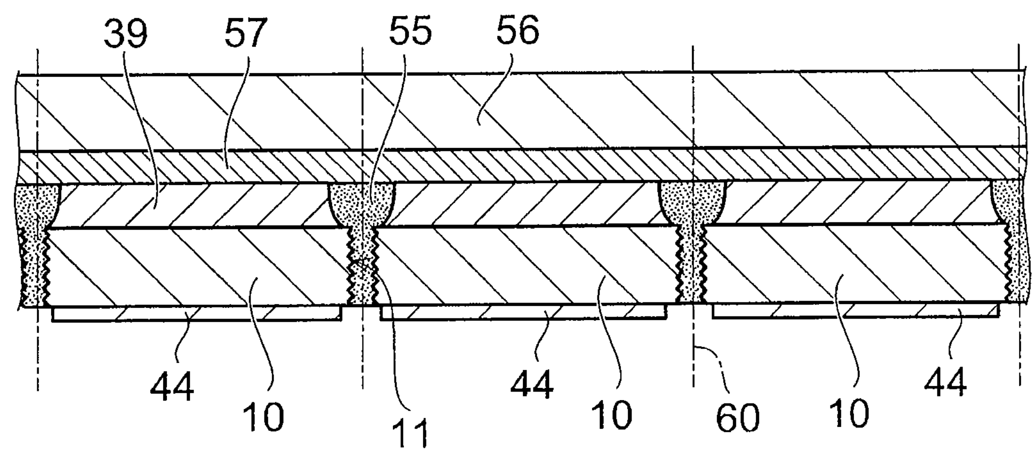

FIGS. 5A to 5C show process sectional views of the method for manufacturing the light emitting element according to this embodiment. More specifically, FIG. 5A is a schematic cross-sectional view in which an unevenness is formed. FIG. 5B is a schematic cross-sectional view in which the trench is filled with a resin. FIG. 5C is a schematic cross-sectional view in which a support plate is bonded.

As shown in FIG. 5A, the inner side surface 54*a* of the trench 54 is subjected to frost treatment, including an etching process using e.g. an acid aqueous solution. Thus, a fine unevenness 11 made of higher order crystal planes is formed. An acid may be HCl, $H_2SO_4$, $H_2O_2$, HF, or a mixture thereof. For instance, using an HCl aqueous solution, the pitch and height difference of the unevenness 11 may be set in the range of 0.1-3 μm. The surface with such an unevenness 11 is also referred to as rough surface. More preferably, if the temperature and concentration of the HCl aqueous solution are selected appropriately, the average of the pitch and height difference of the unevenness 11 is set in the range of 0.3-2 μm.

Subsequently, as shown in FIG. 5B, the second protective layer 53 and the first protective layer 52 are stripped. The trench 54 is filled with a resin 55 such as PMMA (PolyMethyl MethAcrylate). Furthermore, a support plate 56 is laminated. Here, it is more preferable to use electron wax 57 to laminate the support plate 56. Thus, the bonding strength increases. Subsequently, the translucent substrate 10 is grinded from the lower surface side of the translucent substrate 10. When a grinded surface reaches the trench 54 and the substrate 10 attains a desired thickness, the grinding is ended. Furthermore, the surface is made close to a mirror surface by e.g. polish grinding. The final grinded surface 59 is as indicated by the dot-dashed line.

A thickness TW of the translucent substrate 10 having a wafer diameter of 2 inches is in the range of e.g. 250-400 μm before grinding. The depth TD of the trench 54 is set to e.g. 70-170 μm. Consequently, a thickness TR of the trench non-formation region of the translucent substrate 10 falls in the range of e.g. 80-330 μm. A thickness TM of the lower region of the trench 54 is removed by e.g. 10 μm.

A thickness TL of the semiconductor stacked body 39 is in the range of e.g. 5-10 μm. Consequently, the thickness of the light emitting element 5, i.e., TD−TM+TL, can be as thin as in the range of e.g. 65-170 μm. Thus, the unevenness 11 can be formed uniformly and entirely on the side surface 10*a*. On the other hand, in the case where the wafer diameter is 3 inches, the thickness TW of the translucent substrate 10 is in the range of e.g. 400-500 μm. Hence, the portion to be grinded increases.

The technique of dicing from the upper surface side provided with the semiconductor stacked body 39 before grinding the lower surface side of the translucent substrate 10 as described above is called DBG (dicing before grinding). By performing DBG using laser processing instead of a blade dicer, dicing can be performed reliably and accurately. Thus, the chip yield can readily be increased.

Furthermore, as shown in FIG. 5C, a lower electrode 44 is formed. In the case where the translucent substrate 10 is of n-type conductivity, the electrode composition can be AuGe (containing 0.3 wt % Ge, 0.05 μm thick)/Ni/Au (0.5 μm) or AuGe (containing 0.3 wt % Ge, 0.05 μm thick)/Mo/Au (0.5 μm). With the semiconductor stacked body 39 stripped from the support plate 56, the lower electrode 44 is sintered. The resin 55 buried between the chips is removed by e.g. CDE (Chemical Dry Etching). By division at the division plane 60, the chip of the light emitting element 5 in FIG. 1 can be obtained.

Figure 6A:
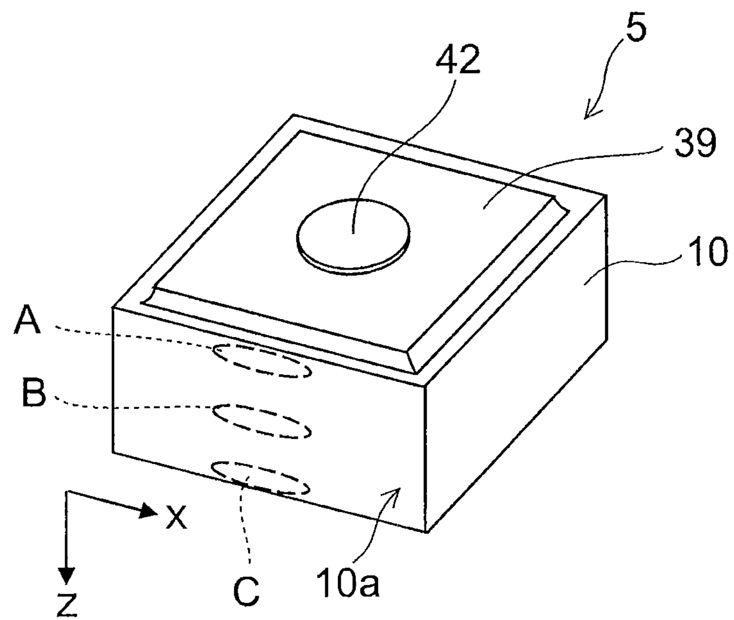
FIGS. 6A to 6C show schematic views illustrating the distribution of the unevenness feature.
Figure 6B:
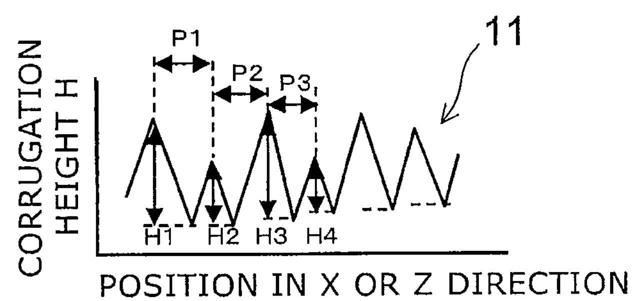
Figure 6C:
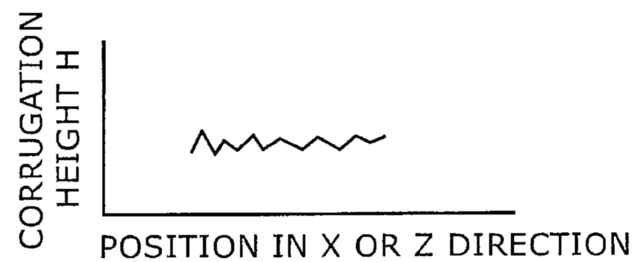

FIGS. 6A to 6C show schematic views illustrating the distribution of the unevenness feature. More specifically, FIG. 6A is a schematic perspective view of the light emitting element. FIG. 6B is a schematic diagram illustrating variation in the unevenness. FIG. 6C is a schematic diagram illustrating a small unevenness.

In FIG. 6A, an unevenness 11 is provided on four side surfaces 10*a* of the translucent substrate 10. As shown in FIG. 6B, A height H defined as the peak-to-valley difference of this unevenness 11 varies as H1, H2, H3, H4 with the position in the XZ plane. A pitch P defined as the peak-to-peak spacing varies as P1, P2, P3 with the position in the XZ plane. However, under the same condition for frost treatment, the average of height H and pitch P in upper region A, intermediate region B, and lower region C of the side surface 10*a* is made uniform. Here, the peak top and valley bottom of the unevenness 11 provided by frost treatment may be smoother than in FIG. 6B.

Here, a SEM (Scanning Electron Microscope) micrograph can be used to measure the relative value of height H and pitch P of the unevenness 11 from the cross-sectional shape of the side surface 10*a*. Furthermore, a SEM micrograph of the surface feature of the unevenness 11 can also be used to measure the relative value of pitch P. The phrase "unevenness with average height and average pitch being uniformly distributed" used herein means that, assuming that maximum error of the relative value in the SEM measurement is e.g. 5%, distribution of the deviations of both the average height and the average pitch is smaller than 5%.

In the lower portion of the trench 54, the fluidity of the acid aqueous solution may be insufficient in the frost treatment. This makes it difficult to equalize the frost treatment condition, and makes it impossible to uniformly form the unevenness 11 as in the upper portion. In this case, for instance, as shown in FIG. 6C, the height and pitch gradually decrease, and the effect of the rough surface decreases.

In contrast, in this embodiment, the lower region of thickness TM of the trench 54 is removed by grinding. Thus, the distribution of height H and pitch P can readily be made uniform on the side surface 10*a* of the translucent substrate 10 from bottom to top after chip division.

In the case of performing frost treatment after grinding the translucent substrate 10 and performing full-cut dicing for complete division into chips, the chip having a small thickness may peel off during processing. This decreases the chip yield. Furthermore, in the case of using a large diameter wafer to increase the mass productivity, there is a limit to thinning the wafer thickness in view of reducing the cracking and chipping of the wafer in the manufacturing process.

In contrast, in this manufacturing method, even if the chip is thinned, the decrease of chip yield can be suppressed. Hence, the mass productivity can be improved. Here, if refractive index of the resin 55 lies between those of GaP and the sealing resin, and the region of the resin 55 is divided by laser processing to leave the resin on the chip side surface, then the light extraction efficiency can readily be further increased.

Figure 7:
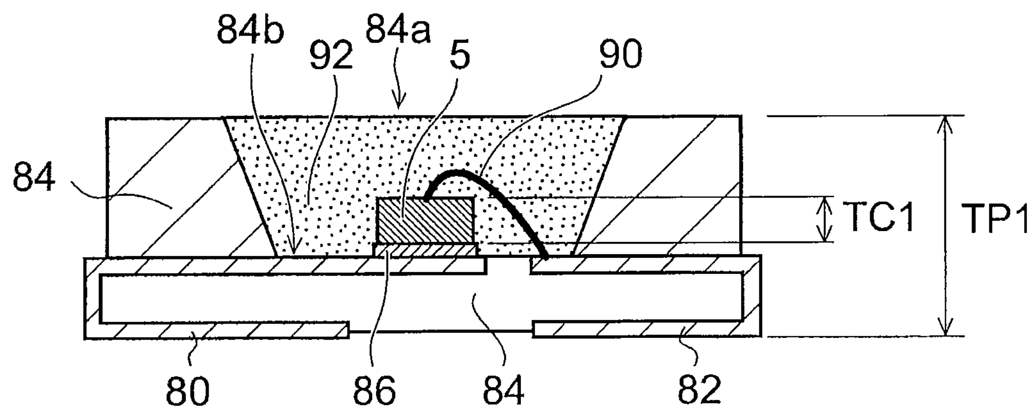
FIG. 7 is a schematic cross-sectional view of a light emitting device.

FIG. 7 is a schematic cross-sectional view of a light emitting device assembled in an SMD type package.

The light emitting element 5 is bonded to one end portion of a first lead (electrode) 80 using e.g. a conductive adhesive 86. The upper electrode of the light emitting element 5 is connected to one end portion of a second lead (electrode) 82 using a bonding wire 90. A molded body 84 made of an insulating member of e.g. thermoplastic resin includes a recess 84*a*. Each of the first and second lead 80, 82 is partly exposed at the bottom surface 84*b* of the recess 84*a*. The light emitting element is provided inside the recess 84*a*. The light emitting element 5 in the recess 84*a* is covered with a sealing resin 92 made of e.g. silicone. The other end portion of the first lead 80 and the other end portion of the second lead 82 extend in opposite directions. According to this embodiment, even if a chip thickness TC1 is e.g. 150 μm or less, a high chip yield can be maintained. Thus, even with the addition of a thickness of the molded body 84 below the light emitting element 5, a height of the bonding wire 90, and a height of the sealing resin above the bonding wire 90, a height TP1 of the light emitting device can readily be reduced to 0.55 mm or less. For instance, TP1 can be reduced to 0.4 mm.

Here, the insulating member may be made of ceramic, and the electrode may be a conductive layer made of a thick film.

Figure 8A:
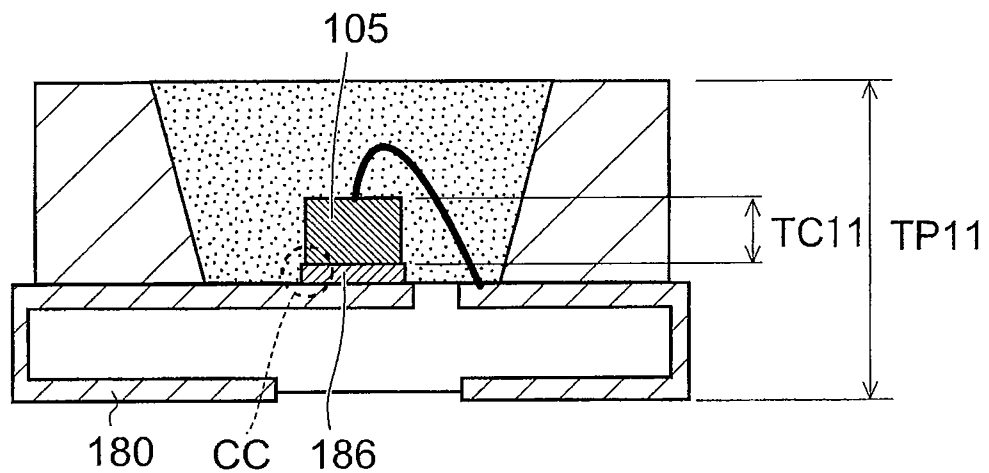
FIGS. 8A and 8B are schematic cross-sectional views of a light emitting device of a comparative example.
Figure 8B:
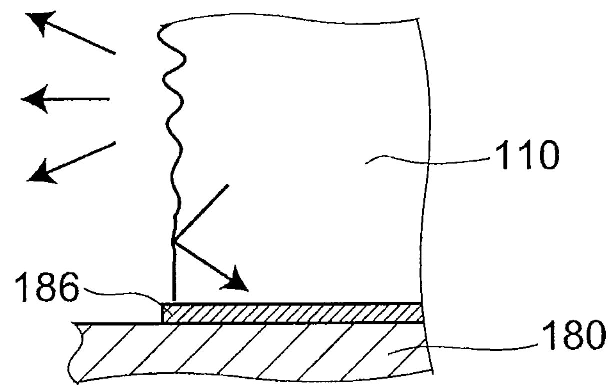

FIGS. 8A and 8B are schematic cross-sectional views of a light emitting device of a comparative example. More specifically, FIG. 8A is a schematic cross-sectional view of the light emitting device including a package. FIG. 8B is a partial schematic cross-sectional view of the chip lower region. A light emitting element 105 of a thickness TC11 is bonded onto a first lead 180 using a conductive adhesive 186. In the case where an unevenness is provided on the side surface of the light emitting element 105 by using full-cut dicing, if the translucent substrate 110 is thinned, the chip of the light emitting element 105 easily peel or drop off in the frost treatment and the subsequent process, and the yield tends to decrease. Thus, the thickness TC11 of the chip is often set to 150-300 μm to keep the chip yield. Hence, a height TP11 of the light emitting device is 0.6-1.9 mm.

Furthermore, in lower region CC of the side surface of the light emitting element 105, the fluidity of the frost treatment liquid decreases, and the height of the unevenness decreases toward the bottom. Thus, total reflection is more likely to occur, and the light extraction efficiency may decrease. The height of the lower region CC from the lower surface of the translucent substrate 110 is e.g. 10 μm.

This embodiment provides a light emitting element with high brightness and low profile, and a method for manufacturing the same with high mass productivity. Such a chip is used to provide a light emitting device with high mass productivity, high brightness, and low profile. This facilitates increasing the brightness and reducing the profile of illumination devices, display devices, and traffic lights.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A light emitting device comprising:

a light emitting element including:

a semiconductor stacked body including a light emitting layer;

a translucent substrate having a one surface with the semiconductor stacked body disposed thereon and a side surface having an unevenness of average height and average pitch uniformly distributed thereon; and a translucent resin covering a side surface of the semiconductor stacked body and the side surface of the translucent substrate;

a first electrode connected to one electrode of the light emitting element;

a second electrode connected to another electrode of the light emitting element;

an insulating member including a recess, each of part of the first electrode and part of the second electrode is exposed at a bottom of the recess, the light emitting element being provided-inside the recess; and a sealing resin layer provided in the recess.

2. The device according to claim 1, wherein refractive index of the translucent resin is higher than refractive index of the sealing resin layer and lower than refractive index of the translucent substrate.

3. The device according to claim 1, wherein the translucent resin includes polymethyl methacrylate.

4. The device according to claim 1, wherein the light emitting layer is made of one of $In_x(Ga_yAl_{1-y})_{1-x}P$ ($0 \leqq x \leqq 1$), $Al_zGa_{1-z}As$ ($0 \leqq z \leqq 1$), and $Ga_sIn_{1-s}N_tAs_{1-t}$ ($0 \leqq s \leqq 1$, $0 \leqq t \leqq 1$), and the translucent substrate is made of one of GaP, SiC, GaN, sapphire, and diamond.

5. The device according to claim 1, wherein the insulating member includes a thermoplastic resin or a ceramic.

6. A method for manufacturing a light emitting element, comprising:

forming a semiconductor stacked body on one surface of a translucent substrate;

forming a trench not reaching another surface of the translucent substrate from a side of the semiconductor stacked body;

forming an unevenness on an inner side surface of the trench; and grinding the translucent substrate up to the trench from the another surface.

7. The method according to claim 6, further comprising:

laminating a support plate on the semiconductor stacked body after the forming the unevenness, the grinding being performed after the laminating the support plate.

8. The method according to claim 6, further comprising:

filling the trench with a resin and laminating a support plate on the semiconductor stacked body after the forming the unevenness, the grinding being performed after the laminating the support plate.

9. The method according to claim 8, further comprising:

forming an electrode on the translucent substrate after the grinding;

stripping the semiconductor stacked body from the support plate; and removing the resin for division into chips.

10. The method according to claim 9, wherein at least part of the resin is removed by irradiation of laser light.

11. The method according to claim 6, wherein the forming the semiconductor stacked body includes:

forming a regrowth foundation layer and a bonding layer in this order above a first substrate;

bonding the bonding layer to the translucent substrate;

removing the first substrate; and forming an upper growth layer including a light emitting layer on the regrowth foundation layer.

* * * * *